United States Patent [19]
Ray

[11] Patent Number: 5,008,637
[45] Date of Patent: Apr. 16, 1991

[54] FULLY INTEGRATED CHARGE PUMP PHASE LOCKED LOOP

[75] Inventor: Daniel L. Ray, Fair Oaks, Calif.

[73] Assignee: Level One Communications, Inc., Folsom, Calif.

[21] Appl. No.: 437,724

[22] Filed: Nov. 15, 1989

[51] Int. Cl.$^5$ .............................................. H03L 7/093
[52] U.S. Cl. ......................................... 331/8; 331/14; 331/17; 331/25
[58] Field of Search ...................... 331/1 A, 8, 14, 17, 331/25

[56] References Cited
U.S. PATENT DOCUMENTS

| | | | |
|---|---|---|---|
| 4,524,333 | 6/1985 | Iwata et al. | 331/17 |
| 4,857,866 | 8/1989 | Tateishi | 331/1 A |
| 4,885,552 | 12/1989 | Boudewijns | 331/17 X |

Primary Examiner—Siegfried H. Grimm
Attorney, Agent, or Firm—Skjerven, Morrill, MacPherson, Franklin & Friel

[57] ABSTRACT

A phase locked loop circuit includes a phase detector and an oscillator associated therewith, and a voltage-to-current converter for providing that lag signals sent thereto from the phase detector provide increased signal to the oscillator, and lead signals sent thereto from the phase detector provide decreased signal to the oscillator.

10 Claims, 3 Drawing Sheets

FULLY INTEGRATED CHARGE PUMP PHASE LOCKED LOOP

BACKGROUND OF THE INVENTION

1. Field of the Invention

This invention relates to phase locked loop systems, and more particularly to means for providing signals between a phase detector and a variable oscillator of the phase locked loop system.

2. Description of the Prior Art

Basically a phase locked loop is a frequency feedback system comprised of a phase detector, a loop filter and a variable oscillator in the feedback path. A well-known type of phase detector is what is known as a lead-lag type. If a constant-frequency external input signal is applied to an input terminal of the phase detector, with the input signal from the variable oscillator being also applied to another input terminal of the phase detector, the phase detector compares the phase and frequency of the input signal with the signal of the variable oscillator and generates a voltage during the period of lag, if the variable oscillator signal lags the reference signal, and generates a voltage during the period of lead, if the oscillator signal leads the reference signal. Such devices are discussed in THE ART OF ELECTRONICS, authored by Paul Horowitz and Winfield Hill, first published 1980, at pages 429–430 thereof. The error voltage is then filtered and applied to the control lead of the variable oscillator thereby varying the oscillator frequency in a direction that reduces the frequency difference between the two signals. When the frequencies of the two signals become sufficiently close, the feedback nature of the system causes the system to lock with the input signal, and the phase detector provides no signal output at all.

In the common design of such a device, the filter includes a resistor and capacitor in series, with the resistor connected to the input lead of the oscillator. The inclusion of such a resistor results in a larger device size than would be necessary if such a resistor could be deleted. In addition to that problem, when using such a resistor, device parameters such as band width and stability are more difficult to control. Furthermore, standard CMOS resistors have a wide tolerance which precludes them from use in typical phase locked loop implementations. Alternatively, using an external resistor introduces a significant noise source and requires the switched currents to be increased to compensate for the large parasitic capacitance inherit in package pins. This increases power dissipation and requires a large filter capacitance.

SUMMARY

It is accordingly an object of this invention to provide a phase locked loop system which avoids the use of resistors in the low pass filter thereof, and may be implemented in CMOS technology.

In accordance with the present invention, a phase locked loop circuit includes a phase detector having a first input lead for receiving a reference signal and a second input lead connected to the output lead of an oscillator, and comprises apparatus for varying the output signal on the output lead of the oscillator, such apparatus comprising normally non-conducting first and second switch means providing conductance therethrough in response to a lag signal from the phase detector, normally non-conducting third and fourth switch means providing conductance therethrough in response to a lead signal from the phase detector, a first conductor connecting the first and third switch means, a second conductor connecting the second and fourth switch means, first current source means connected to the first switch means, such that closing of the first switch means provides connection between the first current source means and first conductor, first current sink means connected to the third switch means, such that closing of the third switch means provides connection between the first current sink means and the first conductor, second current source means connected to the second switch means, such that closing of the second switch means provides connection between the second current source means and the second conductor, second current sink means connected to the fourth switch means such that closing of the fourth switch means provides connection between the second conductor and the second current sink means and second conductor, a capacitor having a terminal connected to the first conductor, a voltage to current converter operatively connected with the capacitor, second conductor and input lead of the oscillator so that upon the first switch means providing conductance in response to the a lag signal, current flows into the capacitor from the first current source means and charge is built on the capacitor to increase the voltage thereacross to in turn vary the signal to the oscillator to in turn vary the output signal of the oscillator, with the oscillator output signal further being varied by the second switch means conducting current via the second current source means in response to a lag signal, and upon the third switch means conducting in response to a lead signal, charge flows from the capacitor via the first current sink means to decrease the voltage thereacross to in turn vary the signal to the oscillator to in turn vary the output signal of the oscillator, with the oscillator output signal further being varied by the fourth switch means through the second current sink means in response to a lag signal.

BRIEF DESCRIPTION OF THE DRAWINGS

Other objects of the invention will become apparent from the study of the following specification and drawings, in which.

DESCRIPTION OF THE PREFERRED EMBODIMENT

Figure 1:
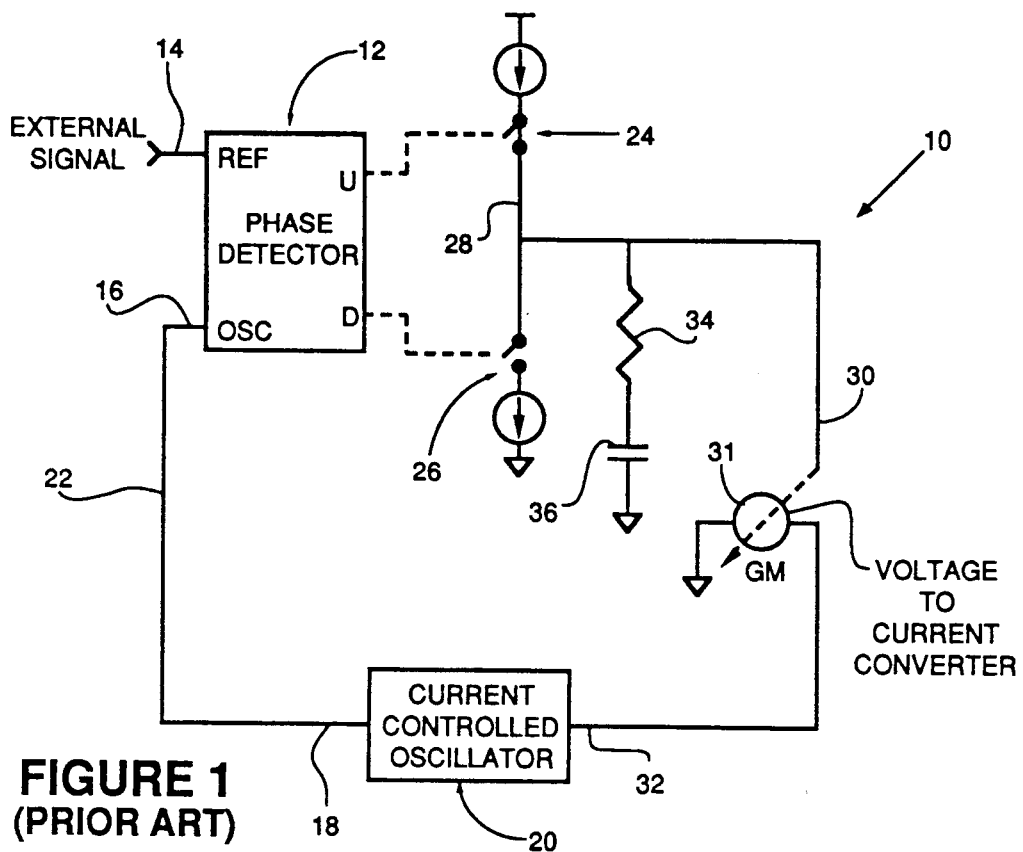
FIG. 1 is a functional drawing of a prior art phase locked loop circuit.
Figure 4:
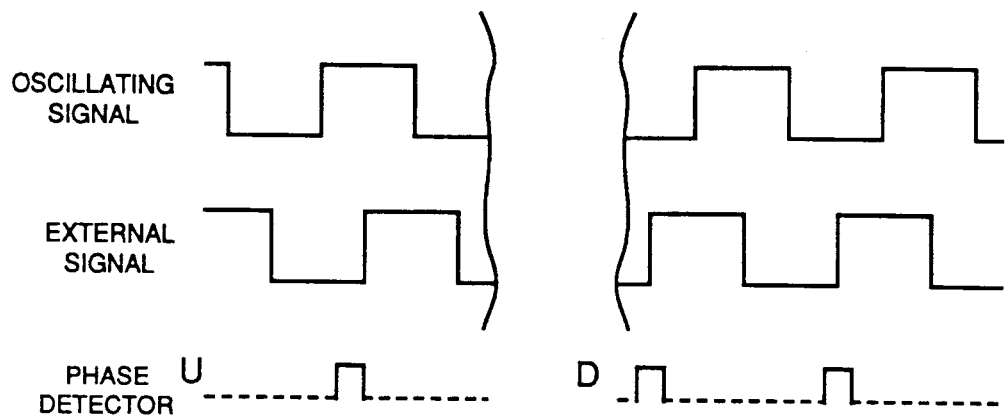
FIG. 4 is a timing diagram appropriate to the lead-lag phase detector of the prior art and the present invention.

Referring first to FIG. 1, a typical prior art phase locked loop circuit 10 is shown. That circuit 10 includes a phase detector 12 having a lead output terminal D and a lag output terminal U, as is well known. The phase detector 12 includes an input lead 14 for receiving an external oscillating reference signal and an input lead 16 connected to output lead 18 of a current controlled oscillator 20 by conductor 22. The phase detector 12 works in the well known manner to provide voltage pulses (FIG. 4) at the lag output terminal U when the oscillator signal output lags the external signal (but only during the lag time starting and ending during the respective rising edges of the reference signal and oscillator signal), and provides voltage pulses at the lead output terminal D when the oscillator signal leads the external signal, (but again, only during lead time starting and ending at the respective rising edges of the oscillator signal and reference signal).

The pulses of voltage at the lag terminal U are used to close normally open switch 24, while the pulses at the lead terminal D are used to close normally open switch 26.

A conductor 28 connects the switches 24, 26, and a conductor 30 is connected to conductor 28 and runs to the controlling input of a voltage to current converter 31 the output lead of which connects to the input lead 32 of current controlled oscillator 20. A resistor 34 is connected to conductor 30 and a capacitor 36 connects the resistor 34 to ground.

In the operation of this circuit 10, a lag signal from terminal U closes the switch 24, with switch 26 remaining open, the resistor 24 and capacitor 26 acting as a filter for the system. With a lead signal being provided, switch 24 is open, with switch 26 closed, the resistor 34 and capacitor 36 again acting as a filter for the system.

As described above, the provision of such a resistor carries with it numerous problems, which the current invention overcomes.

Figure 2:
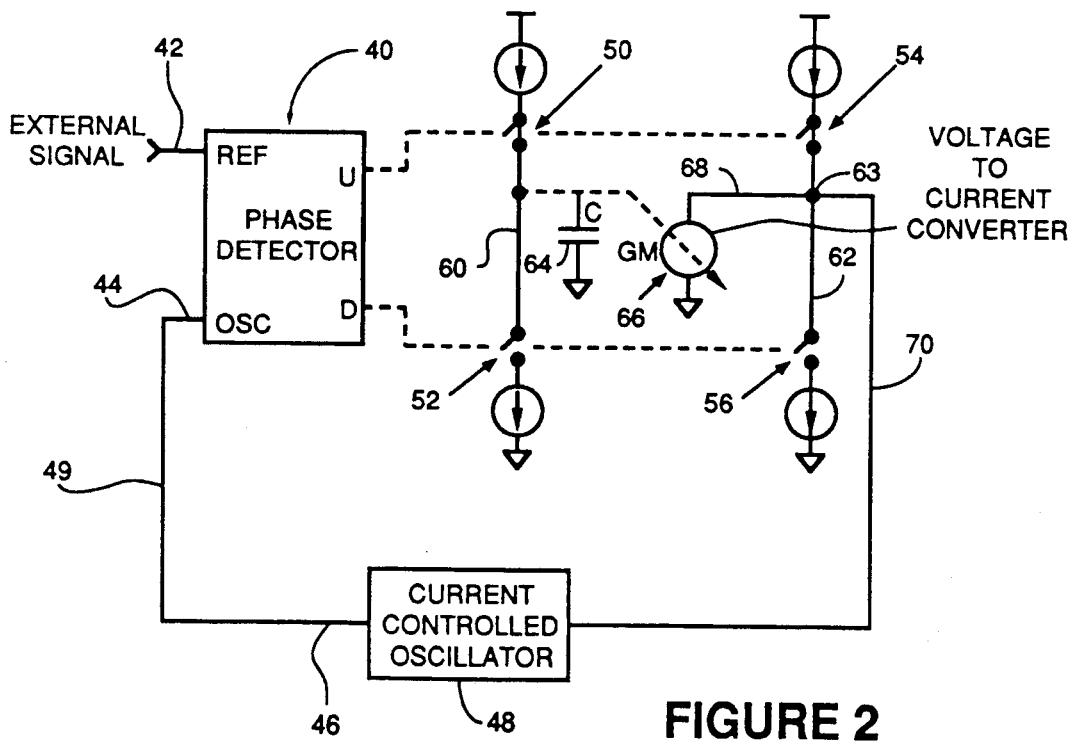
FIG. 2 is a functional drawing view of the phase locked loop circuit of the present invention.
Figure 3:
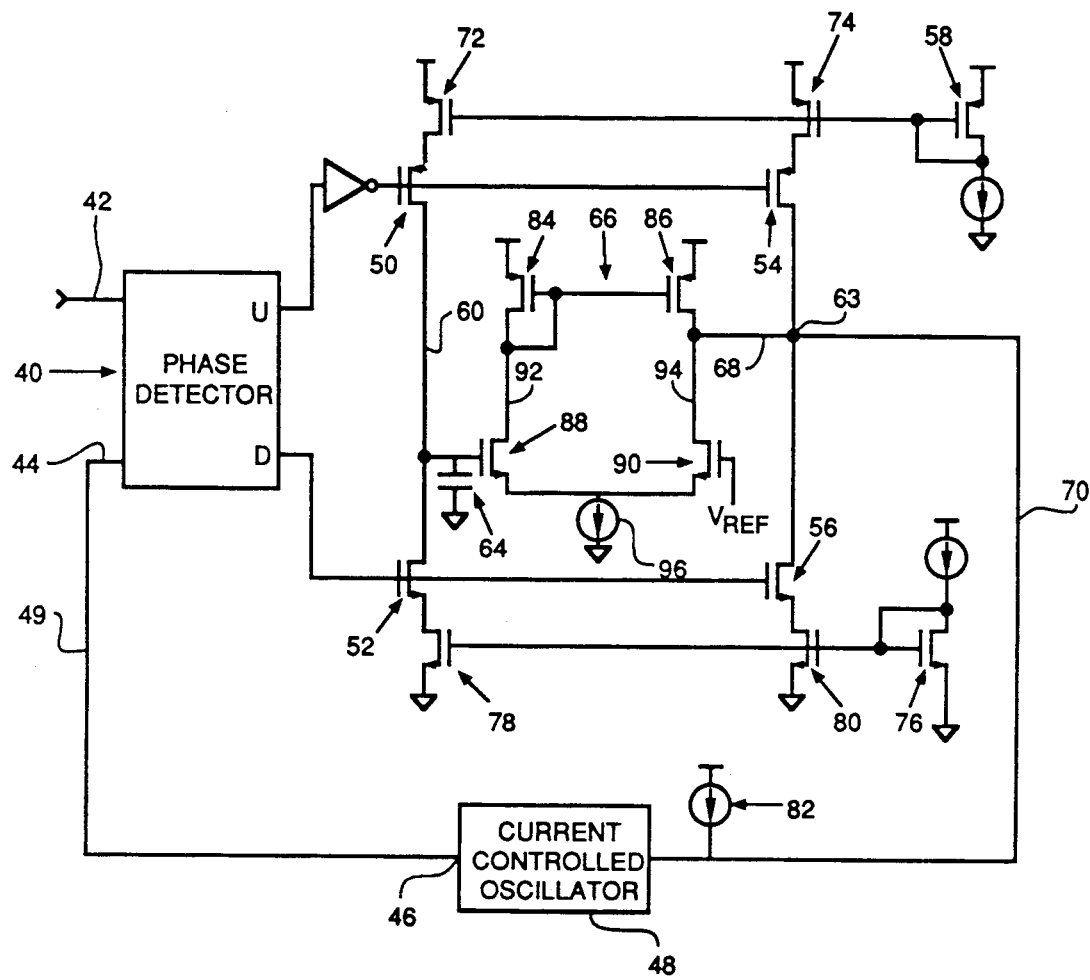
FIG. 3 is a detailed schematic view of the circuit of FIG. 2.

The present invention is shown in FIGS. 2 and 3. As shown therein, a phase detector 40 is again included. The phase detector 40 has an input lead 42 connected to an external reference signal, and another input lead 44 connected to an output terminal 46 of the current controlled oscillator 48 by conductor 49. The current controlled oscillator 48 may with advantage take the form of that shown and described in copending U.S. patent application Ser. No. 436,848, Filed Nov. 15, 1989 and entitled "MULTISTAGE CURRENT-CONTROLLED OSCILLATOR" invented by Daniel L. Ray, and assigned to the assignee of this invention. The circuit includes switches 50, 52, similar to the previous embodiment. It also includes switches 54, 56, the switches 50, 54 being normally open or non-conducting and closable upon a lag signal applied thereto, with the switches 52, 56 being normally open or non-conducting and closable upon a lead signal applied thereto. A conductor 60 connects the switches 50, 52, and a conductor 62 connects the switches 54, 56. A capacitor 64 has one terminal connected to the conductor 60 and the other terminal connected to ground. This capacitor 60 is operatively connected to the controlling input of a voltage-to-current converter 66 the output lead 68 of which connects to the conductor 62 at node 63 which in turn connects to the input conductor 70 of the current controlled oscillator 48.

This circuit is shown in more detail in FIG. 3, wherein the switch means take the form of P channel MOS transistors 50, 54, and N channel MOS transistor 52, 56. A current bias P channel MOS transistor 58 is also included, with its gate tied to its drain, and with its gate connected in common to the gates of P channel MOS transistors 72, 74 (current sources as shown in FIG. 2). The transistor 72 has its drain connected to the source of the transistor 50, while the transistor 74 has its drain connected to the source of transistor 54. The circuit also includes a current bias N channel MOS transistor 76 having its gate tied to its source, and its gate connected in common to the gates of N channel MOS transistor 78 and N channel MOS transistor 80. The transistor 78 has its drain connected to the source of the transistor 52, while the transistor 80 has its drain connected to the source of transistor 56. Transistors 78, 80 are the current sinks of FIG. 2. The devices 72, 74, 58 are size ratioed to set loop bandwidth and stability, as are devices 78, 80 and 76. A free-running set current is applied to the oscillator by means of the current bias means 82.

The voltage-to-current convertor means 66 of FIG. 2 takes the form shown in FIG. 3. Such means include a load P channel MOS transistor 84 having its gate tied to its drain and its gate connected to the gate of another P channel MOS transistor 86. The capacitor 64 has a terminal which is connected to conductor 60 and is also connected to the gate of N channel MOS transistor 88, while an N channel MOS transistor 90 has its gate connected to a reference voltage $V_{ref}$. The drain of transistor 84 and drain of transistor 88 are connected by conductor 92, and the drain of transistor 86 and drain of transistor 90 are connected by conductor 94. The sources of the transistors 88, 90 are tied to a constant current sink 96. Conductor 68 connects node 63 with conductor 94.

In the operation of the circuit, upon a lag signal being applied to gates of the transistors 50, 54, the transistors 50, 54 are in a conducting state, while the transistors 52, 56 are non-conducting. In such situation, current is applied to the current controlled oscillator 48 by the current bias means 82, and also through the transistor 54 and through the conductor 70. With the transistor 50 conducting, charge on the capacitor 64 builds so that increased voltage is applied to the gate of transistor 88. This allows more current to pass through that transistor 88, but because of the constant current sink 96 tied to the sources of the transistors 88, 90, an increased current must pass through the conductor 68 into the conductor 70 connected to the current controlled oscillator 48. Thus, the lag signal is read to increase current to the current controlled oscillator 48 to bring it into phase with the external signal.

In the event that a lead signal is read, the transistors 52, 56 allow conduction therethrough while the transistors 50, 54 are non-conducting, allowing the capacitor 64 to discharge and the voltage applied to the gate of the transistor 88 to decrease. This allows less current through the transistor 88 but because of the constant current sink 96, more current will be allowed through the transistor 90, resulting in less current flow through conductor 68 and through conductor 70 to the current controlled oscillator 48 from the voltage-to-current convertor means. Also with no lag signal to transistor 54, that transistor becomes non-conducting, while transistor 56, with a lead signal applied thereto becomes conducting, decreasing current flow into conductor 70 and the oscillator 66.

Figure 5:
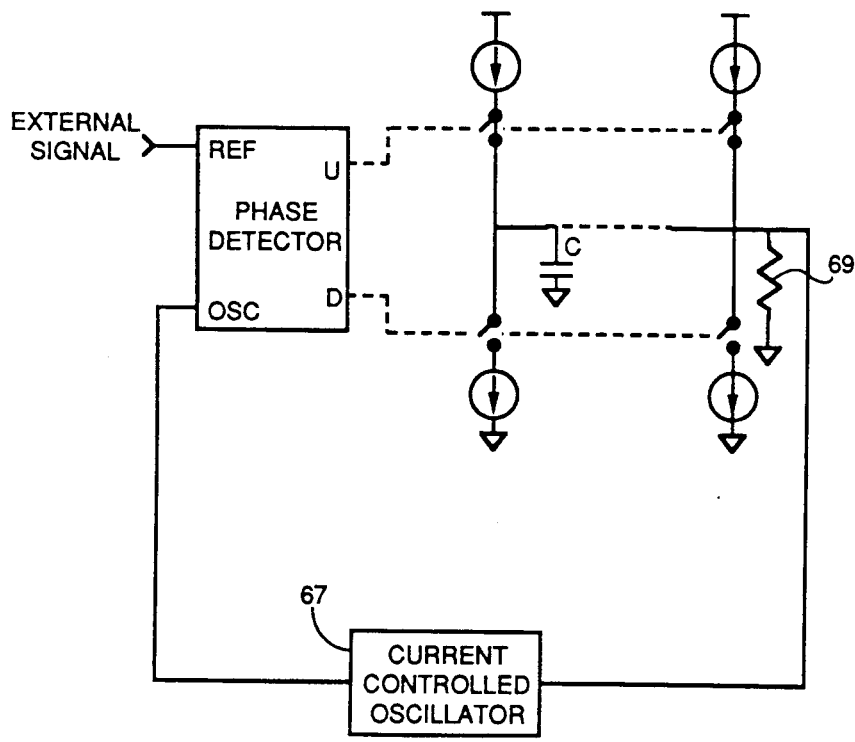
FIG. 5 is a functional drawing showing an alternate embodiment of the invention.

As an alternative the current controlled oscillator 66 of FIGS. 2 and 3 may be replaced by a voltage controlled oscillator 67 (FIG. 5) and resistor 69.

It will thus be seen that the present circuit provides for proper functioning as a phase-locked-loop circuit, without the use of a resistor in the filter portion thereof. This is achieved by directly connecting one terminal of the capacitor 64 to conductor 60, and also directly to the voltage-to-current converter means through transistor 88.

The present circuit is implemented in CMOS technology in accordance with the description above, and with all of the advantages attended thereto.

Although the present invention has been described with reference to a preferred embodiment, those skilled in the art will recognize that modifications may be made thereto without departing from the spirit and scope of the invention, which is defined only by the following claims.

I claim:

1. In a phase locked loop circuit including a phase detector having a first input lead for receiving a reference signal and a second input lead connected to the output lead of an oscillator, apparatus for varying the output signal on the output lead of the oscillator comprising:

normally non-conducting first and second switch means providing conductance therethrough in response to a lag signal from the phase detector;

normally non-conducting third and fourth switch means providing conductance therethrough in response to a lead signal from the phase detector;

a first conductor connecting the first and third switch means;

a second conductor connecting the second and fourth switch means;

a first current source means connected to the first switch means, such that closing of the first switch means provides connection between the first current source means and first conductor;

a first current sink means connected to the third switch means, such that closing of the third switch means provides connection between the first current sink means and the first conductor;

second current source means connected to the second switch means, such that closing of the second switch means provides connection between the second current source means and the second conductor;

second current sink means connected to the fourth switch means such that closing of the fourth switch means provides connection between the second current sink means and the second conductor;

a capacitor having a terminal connected to the first conductor;

a voltage to current converter operatively connected with the capacitor, the second conductor and the input lead of the oscillator so that upon the first switch means providing conductance in response to a lag signal, current flows into the capacitor from the first current source means and charge is built on the capacitor to increase the voltage thereacross to in turn vary the signal to the oscillator to in turn vary the output signal of the oscillator, with the oscillator output signal further being varied by the second switch means conducting current via the second current source means in response to a lag signal, and upon the third switch means conducting in response to a lead signal, charge flows from the capacitor via the first current sink means to decrease the voltage thereacross to in turn vary the signal to the oscillator to in turn vary the output signal of the oscillator, with the oscillator output signal further being varied by the fourth switch means providing conductance through the second current sink means in response to a lead signal.

2. The apparatus of claim 1 wherein the first, second, third and fourth switch means comprise respective first, second, third, and fourth MOS transistors.

3. The apparatus of claim 2 wherein one terminal of the capacitor is connected directly to the drain of the first transistor and the drain of the third transistor by the first conductor, and directly to the voltage-to-current converter input, and wherein the other terminal of the capacitor is connected to ground.

4. The apparatus of claim 3 wherein the first and second transistors comprise P channel transistors and wherein the third and fourth transistors comprise N channel transistors.

5. The apparatus of claim 4 wherein the first and second current source means comprise P channel transistors and the first and second current sink means comprise N channel transistors.

6. The apparatus of claim 5 wherein the first and second current source means comprise P channel transistors whose current values are ratioed against a third P channel transistor to control loop bandwidth and stability.

7. The apparatus of claim 6 wherein the first and second current sink means comprise N channel transistors whose current values are ratioed against a third N channel transistor to control loop bandwidth and stability.

8. The apparatus of claim 1 wherein the oscillator is a current controlled oscillator.

9. The apparatus of claim 1 wherein the oscillator is a voltage controlled oscillator.

10. The apparatus of claim 9 further comprising a resistor connected to the input lead of the oscillator.

* * * * *